US007172916B2

(12) United States Patent
Jung et al.

(10) Patent No.: US 7,172,916 B2
(45) Date of Patent: Feb. 6, 2007

(54) METHOD AND APPARATUS FOR VACUUM-MOUNTING A MICRO ELECTRO MECHANICAL SYSTEM ON A SUBSTRATE

(75) Inventors: Kyu-dong Jung, Suwon (KR); Chan-Bong Jun, Seoul (KR); Hyung Choi, Sungnam (KR); Seok-jin Kang, Suwon (KR); Seog-woo Hong, Busan (KR); Seok-whan Chung, Suwon (KR); Moon-chul Lee, Sungnam (KR); Eun-sung Lee, Daejeon (KR)

(73) Assignee: Samsung Electronics Co., Ltd., Suwon (KR)

( * ) Notice: Subject to any disclaimer, the term of this patent is extended or adjusted under 35 U.S.C. 154(b) by 88 days.

(21) Appl. No.: 10/701,552

(22) Filed: Nov. 6, 2003

(65) Prior Publication Data

US 2004/0115856 A1    Jun. 17, 2004

(30) Foreign Application Priority Data

Nov. 8, 2002    (KR) ............... 10-2002-0069149

(51) Int. Cl.
*H01L 21/00*    (2006.01)
(52) U.S. Cl. ............................................ 438/48
(58) Field of Classification Search ............. 438/52, 438/50; 417/48; 257/414; 73/715
See application file for complete search history.

(56) References Cited

U.S. PATENT DOCUMENTS 5,701,008 A    12/1997    Ray et al.
5,977,706 A  * 11/1999    Cho et al. .................... 313/553
6,241,477 B1 *  6/2001    Brezoczky et al. ........... 417/48
6,467,354 B1 * 10/2002    Allen ........................... 73/715
6,499,354 B1    12/2002    Najafi et al.
2002/0089835 A1    7/2002    Simmons
2003/0085438 A1    5/2003    Habibi et al.

FOREIGN PATENT DOCUMENTS

| EP | 0 786 645 A2 | 7/1997 |
| EP | 0 786 645 A3 | 7/1997 |
| EP | 1 110 905 A1 | 6/2001 |
| JP | 2003-211399 | 7/2003 |
| WO | WO 02/42716 A2 | 5/2002 |
| WO | WO 02/42716 A3 | 5/2002 |

* cited by examiner

*Primary Examiner*—Carl Whitehead, Jr.
*Assistant Examiner*—Monica D. Harrison
(74) *Attorney, Agent, or Firm*—Lee & Morse, P.C.

(57) ABSTRACT

A method and apparatus for vacuum-mounting at least one micro electro mechanical system (MEMS) on a substrate includes a gas injecting section for injecting an inert gas into a vacuum chamber; a substrate aligning section for aligning a semiconductor substrate and a cover, the cover having a cavity formed therein and a getter attached to an interior surface of the cavity; a bonding section for bonding the semiconductor substrate and the cover together; and a controlling section for controlling the substrate aligning section to align the semiconductor and the cover, for controlling the gas injecting section to inject the inert gas into the vacuum chamber, and for controlling the bonding section to bond the semiconductor substrate and the cover together after the inert gas is injected.

19 Claims, 3 Drawing Sheets

METHOD AND APPARATUS FOR VACUUM-MOUNTING A MICRO ELECTRO MECHANICAL SYSTEM ON A SUBSTRATE

BACKGROUND OF THE INVENTION

1. Field of the Invention

The present invention relates to a micro electro mechanical system (MEMS). More particularly, the present invention relates to a method and apparatus for vacuum-mounting at least one MEMS on a substrate.

2. Description of the Related Art

MEMS generally refers to either a micro miniature mechanical device or technology that is fabricated using a semiconductor manufacturing process. MEMS generally involves a micro scale, and thus is sensitive to pollution caused by fine dust particles or peripheral electric signals having extremely low power. In view of this high sensitivity, MEMS fabrication requires special measures so as not to be affected by pollution and the peripheral environment. To satisfy this requirement of special measures, an MEMS manufacturing process includes a process of bonding a cover made of a material, such as glass, to an upper surface of a substrate having an MEMS structure. A vacuum is required between the cover and the substrate to guarantee a stable operation of an MEMS device in view of the properties of the MEMS device.

Conventionally, two vacuum-mounting methods have been primarily utilized to vacuum-mount an MEMS. One method makes use of anodic bonding, and the other method uses a material of getter.

Anodic bonding is a technology for bonding two different structures, such as a glass plate and a silicon substrate, together under high temperature and at a high voltage. In this method, the silicon substrate and the glass plate, which is formed with a cavity, are aligned in a chamber. After the degree of vacuum in the chamber is adjusted using an inert gas, the glass plate is heated to a high temperature while a high voltage is applied to the cover. Thus, glass ions of the cover (i.e., the glass plate) migrate to the silicon substrate, so that the two different structures are bonded. Due to bonding of the two different structures, the cavity is under vacuum conditions.

Alternately, in the vacuum-mounting method using the getter material, a glass plate formed with a cavity is bonded to a silicon substrate, with the getter material attached to a portion of the cavity to enhance the degree of vacuum or the purity of gas contained inside. Thus, the cavity is under vacuum conditions.

However, of the foregoing conventional MEMS vacuum-mounting methods, the vacuum-mounting method using the anodic bonding has a problem in that, as time passes, gas injected into the interior of the cavity exits to the exterior of the cavity, so that a desired degree of vacuum is not maintained. Similarly, the vacuum-mounting method using the getter material has a problem in that, because the cavity is excessively evacuated by the getter material, it is difficult to provide the proper degree of vacuum for either device.

SUMMARY OF THE INVENTION

Accordingly, the present invention has been made in an effort to solve at least some of the above-mentioned problems, and a feature of an embodiment of the present invention is to provide a method and apparatus for vacuum-mounting a micro electro mechanical system on a substrate that is capable of adjusting the degree of vacuum and maintaining the initial degree of vacuum despite the passage of time.

To provide a feature of an embodiment of the present invention, there is provided a method for vacuum-mounting at least one micro electro mechanical system (MEMS) on a substrate, including attaching a getter to an interior surface of a cavity formed on a cover; aligning the cover and a semiconductor substrate in a vacuum chamber; injecting an inert gas into the vacuum chamber to achieve a predetermined degree of vacuum; and bonding the cover and the semiconductor substrate.

The method may further include discharging the inert gas to adjust the degree of vacuum in the vacuum chamber if an excessive amount of inert gas is injected into the vacuum chamber.

In an embodiment of the present invention, aligning the cover and the semiconductor substrate in a vacuum chamber may include adjusting a supporting means for supporting the cover and the semiconductor substrate in a vacuum chamber; and adjusting a transporting means for transporting the cover and the semiconductor substrate in a vacuum chamber.

In an embodiment of the present invention, the bonding may be anodic bonding and may include heating the cover to a predetermined temperature and applying a high voltage to the cover.

To provide another feature of an embodiment of the present invention, there is provided an apparatus for vacuum-mounting at least one micro electro mechanical system (MEMS), including a gas injecting section for injecting an inert gas into a vacuum chamber; a substrate aligning section for aligning a semiconductor substrate and a cover, the cover having a cavity formed therein and a getter attached to an interior surface of the cavity; a bonding section for bonding the semiconductor substrate and the cover together; and a controlling section for controlling the substrate aligning section to align the semiconductor and the cover, for controlling the gas injecting section to inject the inert gas into the vacuum chamber, and for controlling the bonding section to bond the semiconductor substrate and the cover together after the inert gas is injected.

In an embodiment of the present invention, the substrate aligning section includes a supporting means for supporting both the semiconductor substrate and the cover; and a transporting means for transporting both the semiconductor substrate and the cover. In an embodiment of the present invention, the bonding section includes a heat supplying part for applying a predetermined amount of heat to the cover; and a high voltage supplying part for supplying a high voltage to the cover, wherein the controlling section controls the heat supplying part and the high voltage supplying part according to a preset bonding condition.

The apparatus may further include a gas discharging section for discharging the inert gas from the vacuum chamber to adjust a degree of vacuum in the vacuum chamber.

In an embodiment of the present invention, the getter is substantially made of titanium. In an embodiment of the present invention, the inert gas is argon gas. In an embodiment of the present invention, the cover may be a glass plate.

In an embodiment of the present invention, the bonding may be performed after a predetermined time has lapsed after the injection of the inert gas.

According to the method and apparatus for vacuum-mounting at least one micro electro mechanical system (MEMS) as mentioned above, the present invention performs vacuum-mounting on each substrate or wafer, so that each MEMS manufactured on the substrate has a consistent degree of vacuum, thereby increasing yield. In addition, each MEMS continues to maintain a uniform degree of vacuum despite a passage of time.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2002-69149, filed on Nov. 8, 2002, and entitled: "Method and Apparatus for Vacuum-Mounting a Micro Electro Mechanical System on Each Substrate," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
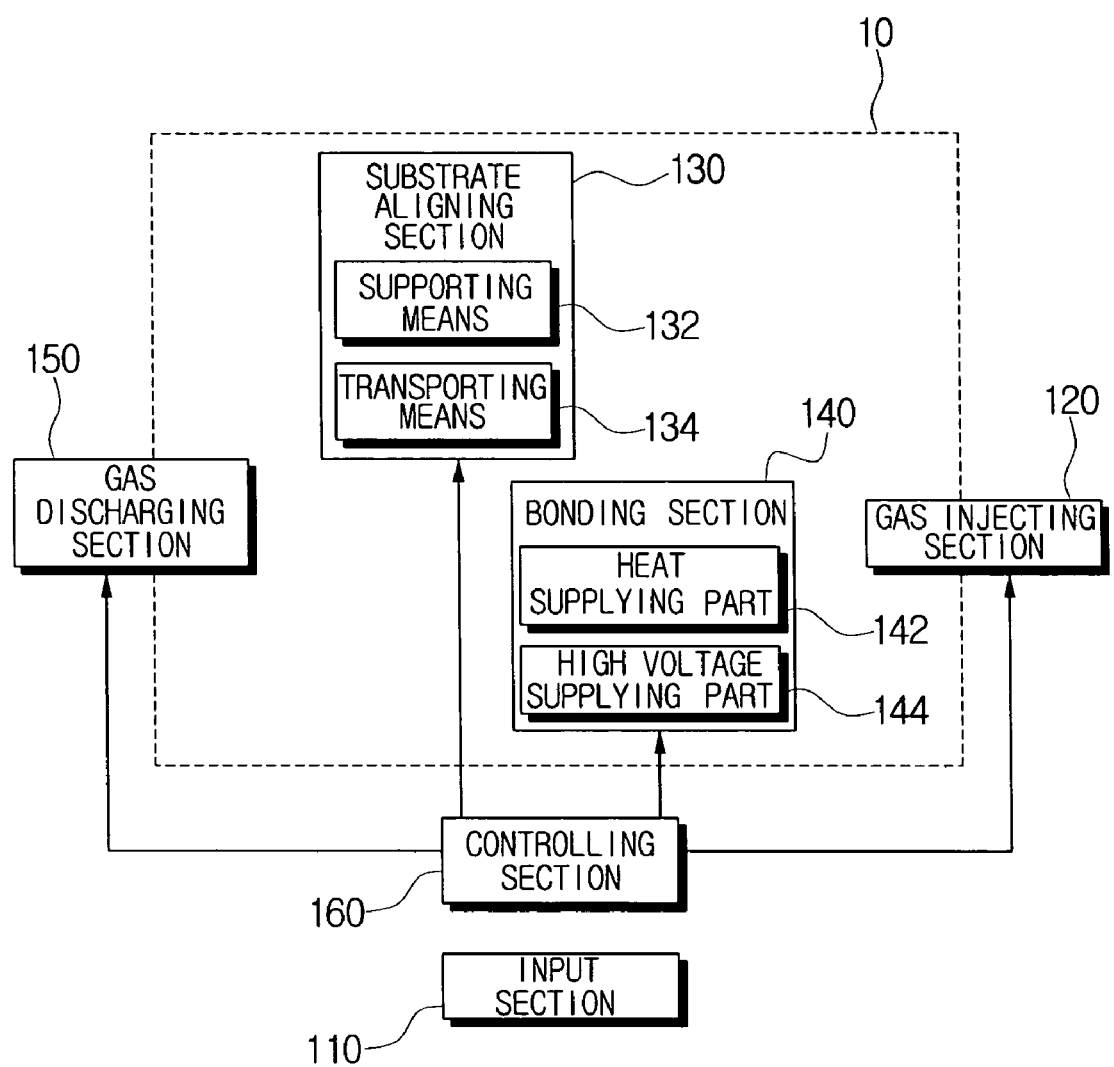
FIG. 1 is a schematic block diagram of an MEMS vacuum-mounting apparatus according to an embodiment of the present invention.
Figure 2:
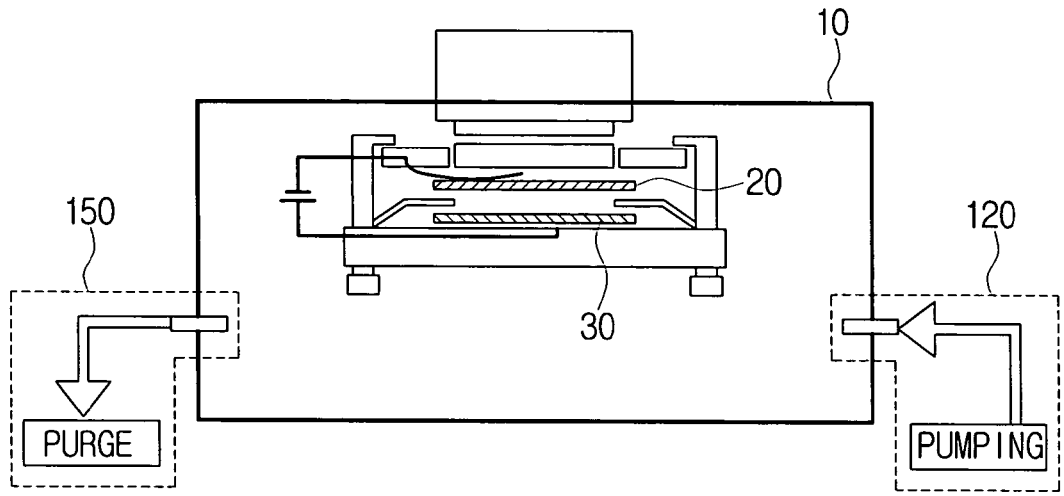
FIG. 2 illustrates a schematic construction of an MEMS vacuum-mounting apparatus according to an embodiment of the present invention.

FIG. 1 is a schematic block diagram of an MEMS vacuum-mounting apparatus according to an embodiment of the present invention. FIG. 2 illustrates a schematic construction of an MEMS vacuum-mounting apparatus according to an embodiment of the present invention. Referring to FIGS. 1 and 2, an MEMS vacuum-mounting apparatus includes a vacuum chamber 10, an input section 110, a gas injecting section 120, a substrate aligning section 130, a bonding section 140, a gas discharging section 150 and a controlling section 160.

The input section 110 is provided with various operating keys (not shown) so that an operator can select various options. Examples of those keys are a key for supplying power (a power supply key), a key for setting the degree of vacuum (a vacuum degree set key), a key for issuing a substrate alignment command (a substrate alignment command key), a key for issuing a gas injection command (a gas injection command key), a key for issuing a gas discharge command (a gas discharge command key), and the like.

The gas injecting section 120 supplies at least one inert gas into the vacuum chamber 10 under the control of the controlling section 160. One example of the inert gas is argon gas.

Under the control of the controlling section 160, the substrate aligning section 130 aligns a semiconductor substrate 30 with a cover 20. The semiconductor substrate 30 is formed with a plurality of MEMS devices. The cover 20 has a getter attached to an interior surface of each cavity, each of which is formed to correspond to the MEMS device of the semiconductor substrate 30. To accomplish this alignment, the substrate aligning section 130 includes a supporting means 132 for supporting both the semiconductor substrate 30 and the cover 20, and a transporting means 134 for transporting both the semiconductor substrate 30 and the cover 20.

Under the control of the controlling section 160, the bonding section 140 bonds the semiconductor substrate 30 and the cover 20. To accomplish this bonding, the bonding section 140 includes a heat supplying part 142 for applying a predetermined amount of heat to the cover 20, and a high voltage supplying part 144 for supplying a high voltage to the cover 20.

The gas discharging section 150 discharges the inert gas injected into the vacuum chamber 10 to adjust the degree of vacuum in the vacuum chamber 10. For example, if an excessive amount of inert gas is injected into the vacuum chamber by the gas injecting section 120, the gas discharging section 150 would discharge a portion of the inert gas from the vacuum chamber.

The controlling section 160 controls the entire operation of the apparatus, such as the injection and discharge of the inert gas into/from the vacuum chamber 10, the alignment of the semiconductor substrate 30 and the cover 20, the anodic bonding of semiconductor substrate 30 and the cover 20, and the like.

Figure 3:
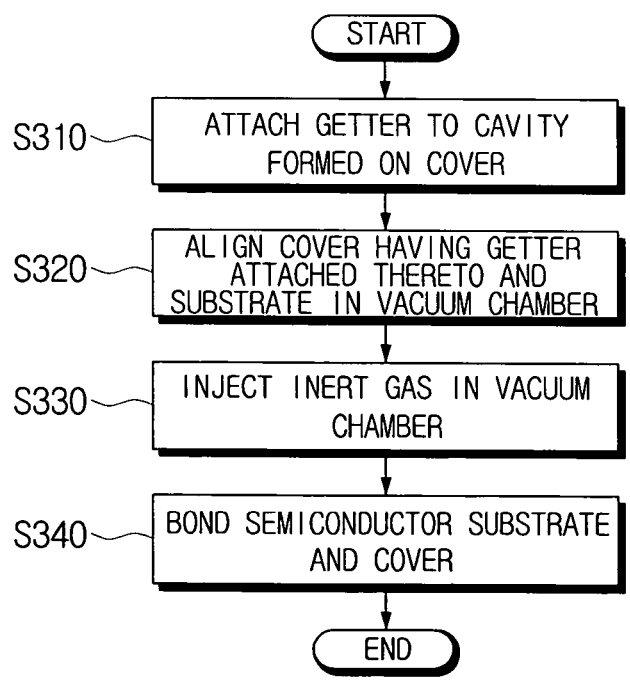
FIG. 3 is a flow chart showing a manufacturing process of the MEMS vacuum-mounting apparatus shown in FIGS. 1 and 2.

FIG. 3 is a flow chart showing a manufacturing process of the MEMS vacuum-mounting apparatus shown in FIGS. 1 and 2. First, in step S310, the getter (22 of FIG. 5) is attached to an interior surface of the cavity formed in the cover 20. In an embodiment of the present invention, the cover 20 may be a glass plate formed with at least one cavity. The cavity of the glass plate is formed to correspond to at least one MEMS device formed on the semiconductor substrate 30. In an embodiment of the present invention, the getter (22 of FIG. 5) may be substantially made of titanium.

Figure 4A:
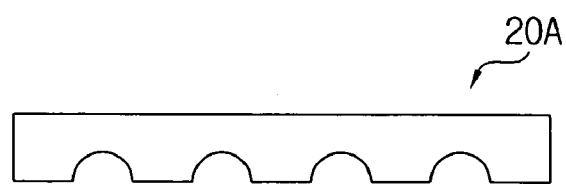
FIGS. 4A and 4B illustrate sectional views of two alternate embodiments of the cover shown in FIG. 2.
Figure 4B:
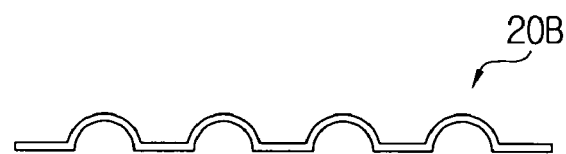

FIGS. 4A and 4B illustrate sectional views of two alternate embodiments of a shape of a cover formed having a plurality of cavities.

In the next step of the method, step S320, an operator positions the cover 20, in which the getter is attached to the cavity, and the semiconductor substrate 30, which is formed with a plurality of MEMS devices, in the vacuum chamber 10. Then, when the operator selects the substrate alignment command key through the input section 110, the controlling section 160 aligns the semiconductor substrate 30 and the cover 20 by adjusting the supporting means 132 and the transporting means 134 in the vacuum chamber 10. Subsequently, when the operator sets the degree of vacuum through the input section 110, and then issues a substrate bonding command, in step S330, the controlling section 160 activates the gas injecting section 120 so that the inert gas is supplied to a gas injection passage connected to the vacuum chamber 10.

At this time, the controlling section 160 measures the degree of vacuum in the vacuum chamber 10 through a sensor (not shown) for detecting the degree of vacuum (hereinafter, referred to as a vacuum degree detection sensor). If it is determined that an excessive amount of gas is injected into the vacuum chamber 10, the controlling section 160 activates the gas discharging section 150 so that the gas injected into the vacuum chamber is appropriately discharged from the vacuum chamber 10. Subsequently, when the vacuum chamber 10 reaches a stable state at a preset degree of vacuum, in step S340, the controlling section 160 activates the bonding section 140 to bond the semiconductor substrate 30 and the cover 20. This bonding is performed similar to an existing anodic bonding process. More particularly, during the bonding operation, a predetermined amount of heat is applied to the cover 20, which may be a glass plate, and then a high voltage is applied to the cover 20 during the heating at a predetermined, elevated temperature. In an embodiment of the present invention, a predetermined amount of time may be allowed to elapse after injecting the inert gas and prior to bonding the semiconductor substrate 30 and the cover 20. The predetermined time refers to a time when the degree of vacuum in the vacuum chamber has stabilized.

Figure 5:
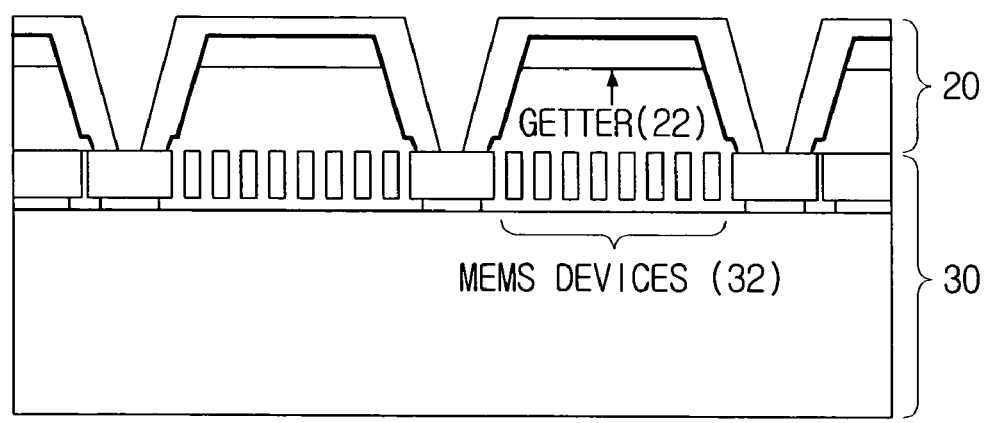
FIG. 5 illustrates a structure in which a semiconductor substrate and a cover are bonded together by means of a vacuum-mounting method according to an embodiment of the present invention.

FIG. 5 illustrates a structure in which a semiconductor substrate 30 and a cover 20 are bonded together by means of a vacuum-mounting method according to an embodiment of the present invention.

The semiconductor substrate 30 has been manufactured to include respective MEMS devices 32 using a conventional process. More specifically, each of the MEMS devices 32 is separated from the semiconductor substrate together with the cover 20, and then is used as an individual device after subsequent processes are performed.

Each MEMS device manufactured through the foregoing process is vacuum-mounted on a wafer or substrate, so that all of the MEMS devices manufactured on the same substrate have a uniform vacuum state. Further, gases discharged from the cavity as time passes in the previous process are all adsorbed to the getter 22, and the degree of vacuum in the cavity remains at the initial manufactured state.

According to the above-mentioned MEMS vacuum-mounting method and apparatus of the present invention, the vacuum degree of each MEMS device is determined by a flow rate of the inert gas introduced into the vacuum chamber, thus it is relatively easy to control the vacuum degree by controlling the inflow of the inert gas.

Further, each MEMS manufactured on the same semiconductor substrate has a consistent degree of vacuum, thereby increasing yield and reducing the resultant cost.

Additionally, each MEMS maintains the degree of vacuum of the initial manufacturing process through the getter, so that reliability of the product is enhanced.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for vacuum-mounting at least one microdevice on a substrate, the method comprising:
    attaching a getter to an interior surface of a cavity formed on a cover;
    aligning the cavity on the cover and the microdevice on the substrate in a vacuum chamber;
    detecting a degree of vacuum in the vacuum chamber;
    adjusting the degree of vacuum in the vacuum chamber to achieve a predetermined degree of vacuum; and
    bonding the cover and the substrate, thereby sealing the cavity.

2. The method as claimed in claim 1, wherein the getter is substantially made of titanium.

3. The method as claimed in claim 1, wherein the bonding is performed after a predetermined time has lapsed after adjusting the degree of vacuum.

4. The method as claimed in claim 1, wherein aligning the cover and the substrate in the vacuum chamber comprises:
    adjusting a supporting means for supporting the cover and the substrate in the vacuum chamber; and
    adjusting a transporting means for transporting the cover and the substrate in the vacuum chamber.

5. The method as claimed in claim 1, wherein bonding the cover and the substrate comprises anodic bonding.

6. The method as claimed in claim 1, wherein bonding the cover and the substrate comprises:
    heating the cover to a predetermined temperature; and
    applying a high voltage to the cover.

7. The method as claimed in claim 1, wherein adjusting the degree of vacuum further comprises injecting an inert gas into the vacuum chamber.

8. The method as claimed in claim 7, wherein the inert gas is argon gas.

9. The method as claimed in claim 7, wherein the adjusting further comprises:
    discharging some of the inert gas in the vacuum chamber if an excessive amount of inert gas is injected into the vacuum chamber.

10. An apparatus for vacuum-mounting at least one microdevice, the apparatus comprising:
    a gas injecting section for injecting an inert gas into a vacuum chamber;
    a substrate aligning section for aligning the microdevice on a substrate and a cavity formed in a cover, the cavity housing a getter;
    a bonding section for bonding the substrate and the cover together; and
    a controlling section for controlling the substrate aligning section to align the substrate and the cover, for adjusting a degree of vacuum in the vacuum chamber to a predetermined degree of vacuum by controlling the gas injecting section, and for controlling the bonding section to bond the substrate and the cover together after the predetermined degree of vacuum is realized, thereby sealing the cavity.

11. The apparatus as claimed in claim 10, wherein the substrate aligning section comprises:
    a supporting means for supporting both the substrate and the cover; and
    a transporting means for transporting both the substrate and the cover.

12. The apparatus as claimed in claim 10, wherein the bonding section comprises:
    a heat supplying part for applying a predetermined amount of heat to the cover; and
    a high voltage supplying part for supplying a high voltage to the cover,
    wherein the controlling section controls the heat supplying part and the high voltage supplying part according to a preset bonding condition.

13. The apparatus as claimed in claim 10, wherein the controlling section controls the bonding section to bond the substrate and the cover to be bonded together after a predetermined time has lapsed after the inert gas is injected.

14. The apparatus as claimed in claim 10, wherein the getter is substantially made of titanium.

15. The apparatus as claimed in claim 10, wherein the inert gas is argon gas.

16. The apparatus as claimed in claim 10, further comprising:
   a gas discharging section for discharging the inert gas from the vacuum chamber to adjust the degree of vacuum in the vacuum chamber.

17. The apparatus as claimed in claim 10, wherein the cover is a glass plate.

18. A method of mounting a microdevice in a controlled vacuum atmosphere, comprising:
   placing a microdevice disposed on a substrate into a controlled vacuum atmosphere of an inert gas, the controlled vacuum atmosphere being at a pressure below atmospheric pressure;
   covering the microdevice with a cover in the controlled vacuum atmosphere, the cover including a getter; and
   sealing the cover to the substrate in the controlled vacuum atmosphere.

19. The method as claimed in claim 18, further comprising, prior to sealing the cover, determining if the pressure of the controlled vacuum atmosphere corresponds to a predetermined pressure; and
   if the pressure does not correspond to the predetermined pressure, adjusting the pressure.

* * * * *